(12) United States Patent
Sakamoto

(10) Patent No.: US 8,296,700 B2
(45) Date of Patent: Oct. 23, 2012

(54) ANALYZING METHOD OF SEMICONDUCTOR DEVICE, DESIGNING METHOD THEREOF, AND DESIGN SUPPORTING APPARATUS

(75) Inventor: Hironori Sakamoto, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 275 days.

(21) Appl. No.: 12/791,535

(22) Filed: Jun. 1, 2010

(65) Prior Publication Data

US 2010/0318950 A1    Dec. 16, 2010

(30) Foreign Application Priority Data

Jun. 9, 2009   (JP) ................................. 2009-138262

(51) Int. Cl.
*G06F 17/50* (2006.01)
(52) U.S. Cl. ........ 716/106; 716/110; 716/111; 716/112; 716/132; 716/136; 703/2; 703/13; 703/14
(58) Field of Classification Search .................. 716/106, 716/110, 111, 112, 132, 136; 703/2, 13, 703/14
See application file for complete search history.

(56) References Cited

U.S. PATENT DOCUMENTS

| 5,502,643 | A  | * | 3/1996 | Fujinaga ......................... 716/51 |
| 6,043,536 | A  | * | 3/2000 | Numata et al. ................ 257/347 |
| 6,452,228 | B1 | * | 9/2002 | Okuno et al. .................. 257/329 |
| 6,697,771 | B1 | * | 2/2004 | Kondo et al. ..................... 703/2 |
| 6,770,944 | B2 | * | 8/2004 | Nishinohara et al. ......... 257/402 |
| 7,078,776 | B2 | * | 7/2006 | Nishinohara et al. ......... 257/408 |
| 7,096,129 | B2 | * | 8/2006 | Kitamaru et al. ............... 702/57 |
| 7,685,543 | B2 | * | 3/2010 | Tsuji et al. .................... 716/106 |
| 7,709,315 | B2 | * | 5/2010 | Tega et al. ..................... 438/201 |
| 7,711,526 | B2 | * | 5/2010 | Maeda et al. ..................... 703/2 |
| 2003/0082839 | A1 | * | 5/2003 | Kitamaru et al. ............... 438/14 |
| 2009/0319966 | A1 | * | 12/2009 | Sakamoto ......................... 716/4 |
| 2009/0319967 | A1 | * | 12/2009 | Sakamoto ......................... 716/4 |

OTHER PUBLICATIONS

Jie et al.; "Accuracy of Surface-Potential-Based Long—Wide-Channel Thick-Base MOS Transistor Models"; Publication Year: 2007; Electron Devices, IEEE Transactions on; vol. 54, Issue: 8; pp. 1897-1909.*

(Continued)

*Primary Examiner* — Helen Rossoshek
(74) *Attorney, Agent, or Firm* — Young & Thompson

(57) ABSTRACT

A design supporting apparatus of a semiconductor device, includes sections to perform: setting an impurity concentration with respect to a channel direction and a depth direction to node points arranged discretely in a channel region of a model transistor based on a predetermined concentration distribution rule; calculating an electric characteristic of the model transistor by using the impurity concentration; and storing the impurity concentration as a model parameter of the model transistor in a storage unit, when the calculated electric characteristic and an electric characteristic prepared previously are coincident with each other within a predetermined range. The device characteristic calculating section calculates a surface potential to each of the node points by reducing a dimension of the impurity concentration in the depth direction, corrects the surface potential based on interaction between the node points adjacent to each other, and calculates the electric characteristic by using the corrected surface potential.

11 Claims, 10 Drawing Sheets

OTHER PUBLICATIONS

Jie et al.; "Implementin spatial variation of impurity concentration in MOS transistor modeling"; Publication Year: 2006; Solid-State and Integrated Circuit Technology, 2006. ICSICT '06. 8th International Conference on; pp. 1220-1226.*

Ueno et al.; "Impurity-profile-based threshold-voltage model of pocket-implanted MOSFETs for circuit simulation Electron"; Publication Year: 2002; Devices, IEEE Transactions on; vol. 49, Issue: 10; pp. 1783.*

Pang et al., "Analytical Subthreshold Surface Potential Model for Pocket n-MOSFETs", IEEE Transactions on Electron Devices, vol. 49, No. 12 Dec. 2002. pp. 2209-2216.

Miura-Mattausch et al., "Unified Complete MOSFET Model for Analysis of Digital and Analog Circuits", IEEE Transactions on Computer Aided Design of Integrated Circuits and Systems vol. 15, No. 1 Jan. 1996.

* cited by examiner

ANALYZING METHOD OF SEMICONDUCTOR DEVICE, DESIGNING METHOD THEREOF, AND DESIGN SUPPORTING APPARATUS

INCORPORATION BY REFERENCE

This patent application claims a priority on convention based on Japanese Patent Application No. 2009-138262 filed on Jun. 9, 2009. The disclosure thereof is incorporated herein by reference.

TECHNICAL FIELD

The present invention relates to an analyzing method of a semiconductor device, a designing method thereof, and a design supporting apparatus thereof, and in particular to analyzing and designing methods of a semiconductor device using a model transistor using an accurate channel impurity concentration distribution.

BACKGROUND ART

Techniques for analyzing characteristics of an electronic device such as a transistor have been known. For example, a technique for analyzing characteristics of a MOS transistor is disclosed in a non-patent literature 1.

FIG. 1 is a sectional view showing a configuration of a model transistor described in the non-patent literature 1. A MOS transistor 150 as a model transistor includes a gate electrode 151, a gate oxide film 152, a drain region 153, a channel region 154 and a source region 155. The channel region 154 is formed between the source region 155 and the drain region 153 below the gate electrode 151 and the gate oxide film 152. In the non-patent literature 1, the channel region 154 is divided into three regions, and widths and impurity concentrations of the respective regions are calculated as model parameters to perform analysis and design of a semiconductor device by using the model parameters.

Here, it is supposed that respective widths of the three channel regions in a channel direction are represented as $L_1$, $L_2$, and $L_1$ and impurity concentrations thereof are represented as $N_p$, $N_c$, and $N_p$. Temporary setting is performed to coincide with a channel impurity concentration distribution in an actual transistor excellently by using $L_1$, $L_2$, $N_p$, and $N_c$ as the model parameters. Next, regarding each of the channel regions, a surface potential thereof is determined by solving a Poisson equation using the surface potential as a variable. Subsequently, electric characteristics of the transistor are calculated by using the determined surface potentials.

The electric characteristics of the transistor are exemplified as gate capacity $C_{gg}$—gate voltage $V_c$ characteristic and threshold voltage $V_{th}$—substrate voltage $V_B$ characteristic (or drain current $I_D$—substrate voltage $V_{Bb}$ characteristic). As a method of calculating these electric characteristics of the transistor, a method described in the non-patent literature 1 or a method conventionally known widely can be used. Here, when the determined electric characteristic of the transistor (calculation values) do not coincide with electric characteristics of an actual transistor (measurement values), the above-mentioned calculation is repeated while the temporarily set model parameters $L_1$, $L_2$, $N_p$, and $N_c$ are changed. On the other hand, when the calculation values coincide with the measurement values, it is thought that the temporarily set model parameters $L_1$, $L_2$, $N_p$, and $N_c$ represent the channel impurity concentration distribution of the actual transistor.

Thus, analysis or design of a semiconductor device is performed by using the determined model parameters.

It should be noted that the method of calculating electric characteristics of a transistor is described in non-patent literature 2.

Citation List

Non-patent literature 1: "Analytical Subthreshold Surface Potential Model for Pocket n-MOSFETs" (IEEE Trans. On Electron Devices, Vol. 49, No. 12, pp. 2209-2216, 2002) by Y. S. Pang, et al.

Non-patent literature 2: "Unified complete MOSFET model for analysis of digital and analog circuits" (Proc. IEEE Trans. On Comput.-Aided Des./Int. Conf. Comput. Aided Des., vol. 15, no. 1, pp. 1-7, January, 1996) by M. Miura-Mattausch, U. Feldmann, A. Rahm, M. Bollu, and D. Savignac

SUMMARY OF THE INVENTION

In general, an impurity concentration in a channel direction varies continuously. In the non-patent literature 1, however, since the channel region 154 is divided into three regions and the model parameter is set under the assumption that impurity concentrations of the respective regions are constant. Therefore, the impurity distribution in the channel direction cannot be expressed accurately. Further, since an analytic approximation solution of a pseudo two-dimensional Poisson equation is used, an accurate surface potential cannot be calculated. Accordingly, transistor electric characteristics expressed by a model transistor cannot be expressed in a high accuracy, especially in a saturation region, so that an error is introduced into analysis and design of a semiconductor device.

In an aspect of the present invention, a method of analyzing a semiconductor device, is achieved: by setting an impurity concentration with respect to a channel direction and a depth direction to node points arranged discretely in a channel region of a model transistor based on a predetermined concentration distribution rule; by calculating a surface potential to each of the node points by reducing a dimension of the impurity concentration in the dept direction; by correcting the surface potential based on interaction between the node points adjacent to each other to generate the corrected surface potential; by calculating an electric characteristic of the model transistor by using the corrected surface potential; and by storing the impurity concentration as a model parameter of the model transistor in a storage unit, when the calculated electric characteristic and an electric characteristic prepared previously are coincident with each other within a predetermined range.

In another aspect of the present invention, a design supporting apparatus of a semiconductor device, includes: a model parameter setting section configured to set an impurity concentration with respect to a channel direction and a depth direction to node points arranged discretely in a channel region of a model transistor based on a predetermined concentration distribution rule; an device characteristic calculating section configured to calculate an electric characteristic of the model transistor by using the impurity concentration; and a determining section configured to store the impurity concentration as a model parameter of the model transistor in a storage unit, when the calculated electric characteristic and an electric characteristic prepared previously are coincident with each other within a predetermined range. The device characteristic calculating section calculates a surface potential to each of the node points by reducing a dimension of the impurity concentration in the dept direction, corrects the surface potential based on interaction between the node points adjacent to each other to generate the corrected surface potential, and calculates the electric characteristic of the model transistor by using the corrected surface potential.

In still another aspect of the present invention, in a computer-readable recording medium, a computer-executable program code is stored to attain an analyzing method of a semiconductor device. The analyzing method is achieved: by setting an impurity concentration with respect to a channel direction and a depth direction to node points arranged discretely in a channel region of a model transistor based on a predetermined concentration distribution rule; by calculating a surface potential to each of the node points by reducing a dimension of the impurity concentration in the dept direction; by correcting the surface potential based on interaction between the node points adjacent to each other to generate the corrected surface potential; by calculating an electric characteristic of the model transistor by using the corrected surface potential; and by storing the impurity concentration as a model parameter of the model transistor in a storage unit, when the calculated electric characteristic and an electric characteristic prepared previously are coincident with each other within a predetermined range.

From the above, according to the present invention, electric characteristics of a transistor can be reproduced in a high accuracy without depending on a bias condition. Also, an actual channel impurity concentration distribution can be estimated from the calculated electric characteristics of a transistor accurately. Further, by using an accurate model parameter, accurate circuit design can be achieved, and by using the accurate model parameter, accurate analysis of electric characteristic of a transistor can be achieved.

BRIEF DESCRIPTION OF THE DRAWINGS

The above and other objects, advantages and features of the present invention will be more apparent from the following description of certain embodiments taken in conjunction with the accompanying drawings, in which.

DESCRIPTION OF EMBODIMENTS

Figure 1:
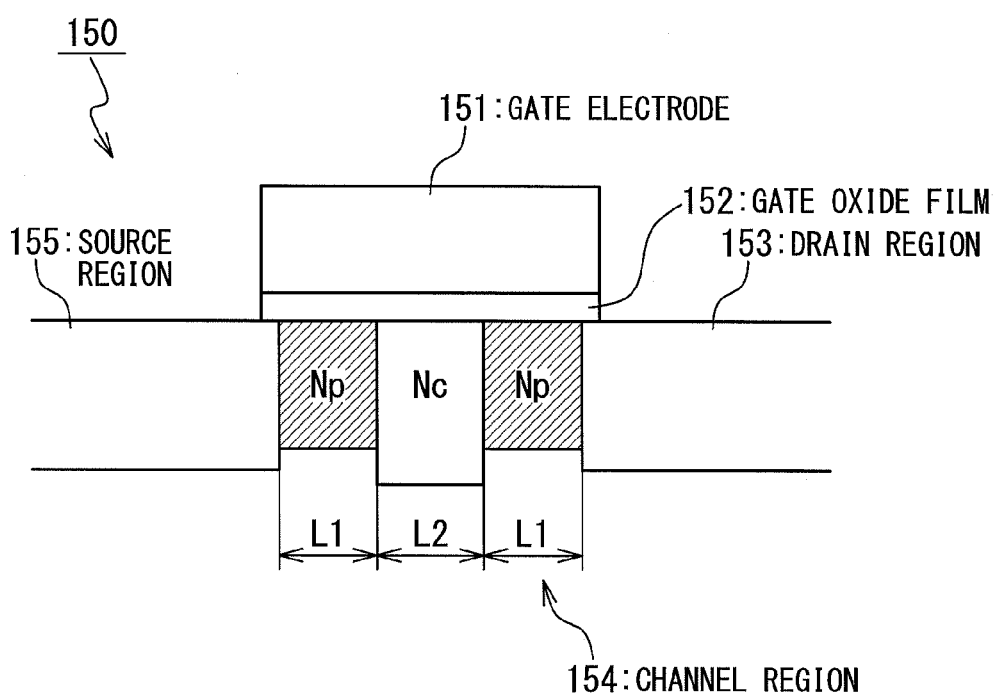
FIG. 1 is a sectional view showing a model configuration of a MOS transistor according to a conventional technique.

Hereinafter, a semiconductor device design supporting apparatus (hereinafter, to be simply referred to as a "design supporting apparatus") of the present invention will be described in detail with reference to the attached drawings. In the drawings, same or similar reference numerals are assigned to same or similar components, respectively.

[First Embodiment]

Figure 2:
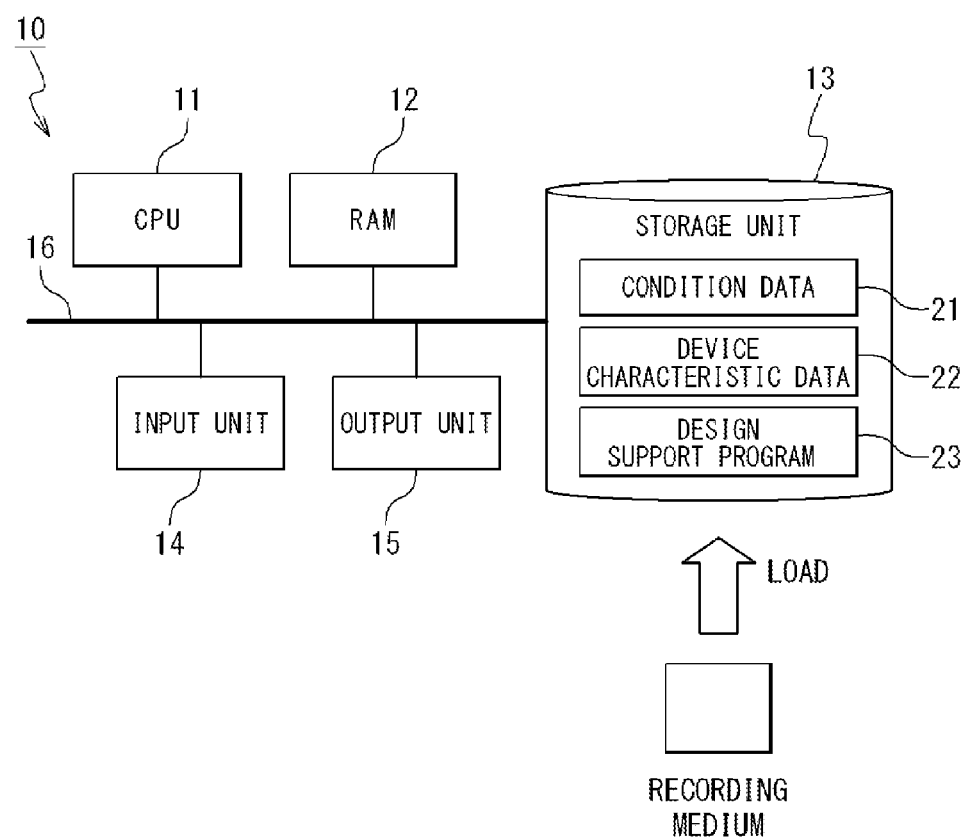
FIG. 2 is a diagram showing a configuration of a design supporting apparatus of a semiconductor device according to the present invention.

Referring to FIGS. 2 to 5, a configuration of a design supporting apparatus 10 according to a first embodiment of the present invention will be described. FIG. 2 is a configuration diagram showing the design supporting apparatus 10 according to the first embodiment of the present invention. The design supporting apparatus 10 is provided with a CPU 11, a RAM 12, a storage unit 13, an input unit 14, and an output unit 15 which are connected mutually via a bus 16. The storage unit 13 is an external storage unit such as a hard disc and a memory. Further, the input unit 14 such as a keyboard and a mouse is operated by a user to input various data to the CPU 11 or the storage unit 13. The output unit 15 is such as a monitor or a printer, and it visibly outputs a layout result of a semiconductor device outputted from the CPU 11 to a user.

The storage unit 13 stores condition data 21, device characteristic data 22, and a design support program 23 therein. The design support program 23 is installed from a recording medium (not shown) into the storage unit 13. The CPU 11 executes the design support program 23 within the storage unit 13 in response to an instruction inputted from the input unit 14 to perform analysis of a device characteristic of a model transistor, a circuit design or the like. At this time, various data and the program from the storage unit 13 are temporarily stored in the RAM 12, and the CPU 11 performs various processes by using data within the RAM 12.

The condition data 21 includes data of manufacturing conditions of a transistor, a size of the transistor, and operation conditions of the transistor. The data of the manufacturing conditions are such as an ion implantation condition and a diffusion condition for a gate electrode, and diffusion layers (source region/drain region), and may include data about a gate dielectric (insulating or oxide) film. As the manufacturing conditions data, elementary charge amount q, dielectric constant of silicon $\bullet_{Si}$, dielectric constant of oxide film $\bullet_{ox}$, mobility of carrier $\bullet$, intrinsic carrier density $n_i$, and Boltzmann constant $k_B$ are exemplified. Further, as the data of the size (configuration) of the transistor, a gate length $L_{gate}$, a gate width W, and an oxide film thickness $T_{ox}$ are exemplified. Furthermore, as the data of the operation conditions (bias conditions) of the transistor, a substrate voltage $V_B$, a gate voltage $V_G$, a flat band voltage $V_{FB}$, and an operation temperature T are exemplified.

The device characteristic data 22 is data concerned with actually-measured values of electric characteristic of the transistor. For example, gate capacity $C_{gg}$—gate voltage $V_G$ characteristic and threshold voltage $V_{th}$—substrate voltage $V_B$ characteristic (or drain current $I_D$—substrate voltage $V_{Bb}$ characteristic) measured on an actual transistor are stored in the storage unit 13 as the device characteristic data 22.

Figure 3:
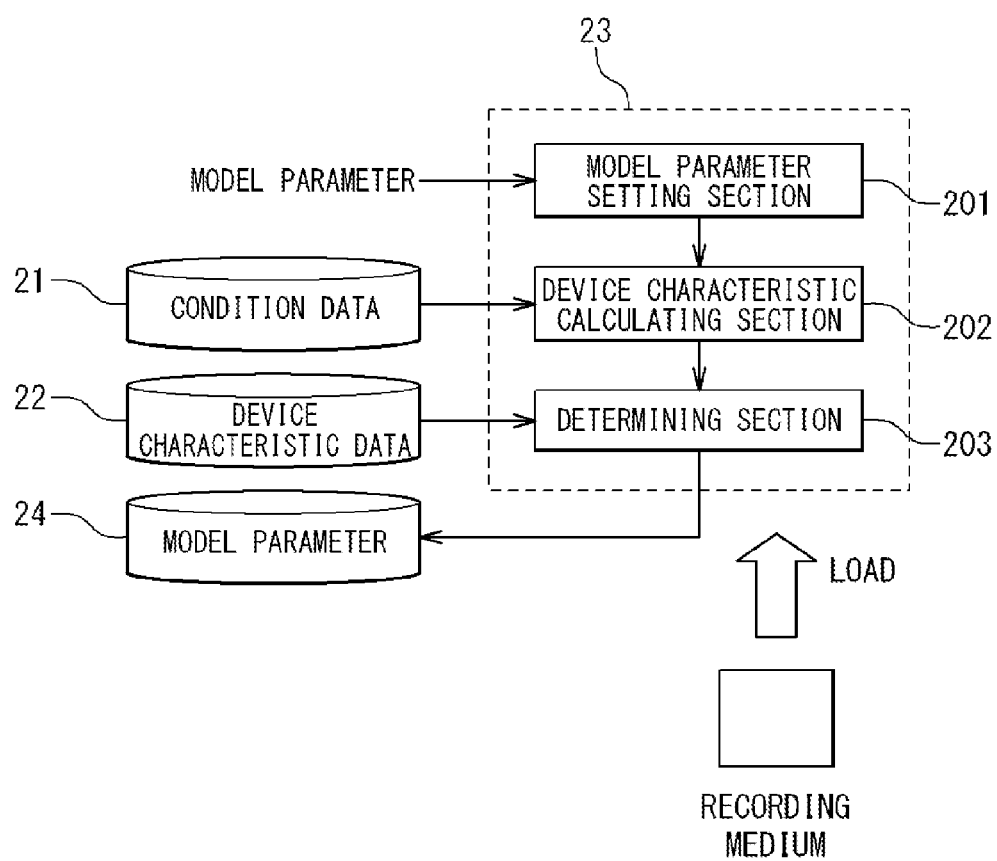
FIG. 3 is a functional block diagram showing a configuration of the design supporting apparatus according to a first embodiment of the present invention.

As shown in FIG. 3, the design support program 23 in the first embodiment is executed by the CPU 11, to realize respective functions of a model parameter setting section 201, a device characteristic calculating section 202, and a determining section 203.

Figure 4:
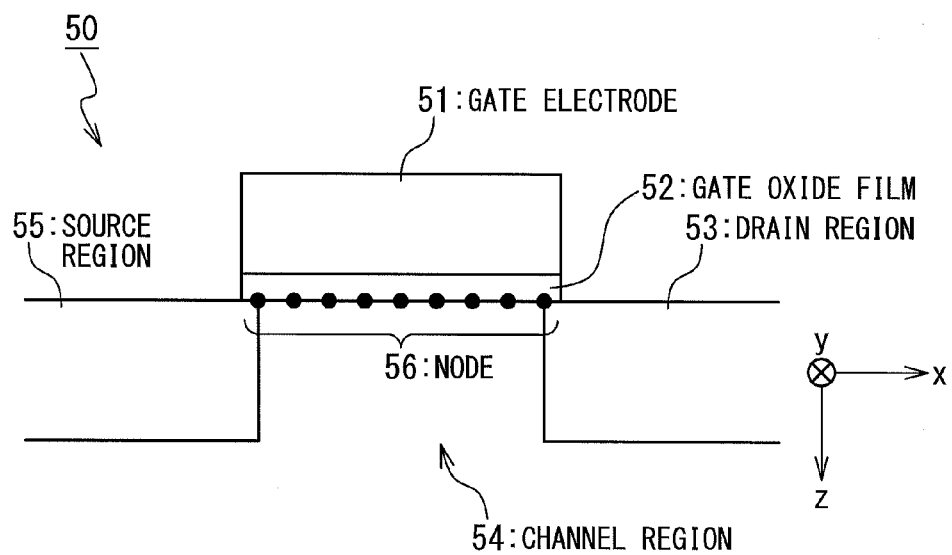
FIG. 4 is a sectional view showing a model transistor to be calculated and node points in device analysis according to the present invention.

The model parameter setting section 201 sets a temporary model parameter as a model parameter of a model transistor to calculate a channel impurity concentration. Specifically, as shown in FIG. 4, the model parameter setting section 201 discretely generates a plurality of node points 56 in a channel region 54 of the model transistor 50 in a channel direction (x direction) and calculates an impurity concentration N(x, z) for each of the node points 56. At this time, it is preferable that the impurity concentrations N(x, z) are set based on a channel impurity concentration distribution rule of an actual transistor. For example, when it is assumed that the channel impurity concentration distribution in the channel direction (x direction) depend on a Gaussian distribution shown in FIG. 5, the model parameter setting section 201 sets $N_c(z)$, $N_p(z)$, and $L_p$ in the following Equation (1) as a temporary model parameter. The parameters $N_c(z)$, $N_p(z)$, and $L_p$ of the temporary model parameter may be arbitrary numerical values inputted from the input unit 14, or they may be numerical values selected from numerical values previously set in the storage unit 13. Further, the model parameter setting section 201 sets the temporary model parameter $N_c(z)$, $N_p(z)$, and $L_p$ into the Equation (1) to calculate the impurity concentrations N(x, z). Thus, the impurity concentrations N(x, z) in the respective node points 56 are set.

$$N(x, z) = N_c(z) + N_p(z)\left(\exp\left(-\frac{x^2}{2L_p^2}\right) + \exp\left(-\frac{(L-x^2)}{2L_p^2}\right)\right) \quad (1)$$

The device characteristic calculating section 202 calculates a device characteristic of the transistor by using the impurity concentrations N(x, z) set at the model parameter setting section 201. The device characteristic calculating section 202 calculates electric characteristics of the transistor by using the condition data 21 corresponding to the model transistor extracted from the storage unit 13 and the impurity concentrations N(x, z) in the respective node points 56. The electric characteristic calculated are such as the gate capacity $C_{gg}$—gate voltage $V_G$ characteristic of the model transistor and the threshold voltage $V_{th}$—substrate voltage $V_B$ characteristic (or drain current $I_D$—substrate voltage $V_B$ characteristic) thereof.

Details of a calculating method of electric characteristic will be described below.

The device characteristic calculating section 202 solves a Poisson equation shown by the following Equation (2) in a depth direction (z direction in FIG. 5) in the respective node points 56 by using the set impurity concentrations N(x, z) to calculate a surface potential $\phi_{s0}$, an an effective impurity concentration $N_{sub}$, and a depletion layer width $W_{dep}$ in each of the node points 56.

$$C_{ox}(V_G - V_{FB} - \phi_{s0}) = C\sqrt{\frac{N_{sub}}{N_{sub0}}(\beta(\phi_{s0} - V) - 1 + \exp(-\beta(\phi_{s0} - V_B))) + \exp(\beta(\phi_{s0} - \phi_f - 2\Phi_B))} \quad (2)$$

where $C_{ox}$ is expressed by the following Equation (3), C is expressed by the following Equation (4), $\phi_B$ is expressed by the following Equation (5), • is expressed by the following the following Equation (6), $\phi_{s0}$ is expressed by the following Equation (7), $N_{sub}$ is expressed by the following Equation (8), and $N_{sub0}$ is expressed by the following Equation (9). Here, $V_G$ is a gate voltage, $V_B$ is a substrate voltage, $V_{F3}$ is a flat band voltage, $N_{sub0}$ is a surface effective impurity concentration, $\phi_B$ is an energy difference between a quasi-Fermi level and an intrinsic Fermi level, $\phi_f$ is the quasi-Fermi level, $•_{ox}$ is a dielectric constant of $SiO_2$ (gate oxide film), $T_{ox}$ is a film thickness of gate oxide film, q is an elementary charge amount, $•_{Si}$ is a dielectric constant of silicon, • is a thermal voltage, $k_B$ is the Boltzmann constant, T is an operation temperature (absolute temperature), and $n_i$ is an intrinsic carrier density.

$$C_{ox} = \frac{\varepsilon_{ox}}{T_{ox}} \quad (3)$$

$$C = \sqrt{\frac{2\varepsilon_{Si} q N_{sub0}}{\beta}} \quad (4)$$

$$\phi_B = \frac{1}{\beta}\log\left(\frac{N_{sub0}}{n_i}\right) \quad (5)$$

$$\beta = \frac{q}{k_B T} \quad (6)$$

$$\phi_{s0} = \frac{q}{\varepsilon_{Si}} \int_0^{W_{dep}} N(x, z)z\,dz + \frac{1}{\beta} + V_B \quad (7)$$

$$N_{sub} = \frac{\left(\int_0^{W_{dep}} N(x, z)dz\right)^2}{2\int_0^{W_{dep}} N(x, z)z\,dz} \quad (8)$$

$$N_{sub0} = N(x, 0) \quad (9)$$

The device characteristic calculating section 202 calculates the surface potentials $\phi_s$ by using the surface potential $\phi_{s0}$ in each of the node points 56 and considering interaction between the node points adjacent to each other (existing within a predetermined range). Here, the surface potential $\phi_s$ is calculated, assuming that a current $I_D$ between adjacent node points is constant in the plurality of node points 56 and considering interaction due to charge density $Q_{b0}$ in an inversion layer (bulk) surface. That is, the device characteristic calculating section 202 solves simultaneous equations of a current continuation equation expressed by the following Equation (10) to indicate that a current $I_D$ between the node points is constant, and a quasi two-dimensional Poisson equation considering a charge density $Q_{b0}$ by using the surface potential $\phi_{s0}$ as an initial value, through an iterative calculation method. Thus, the surface potential $\phi_s$ and the quasi-Fermi level $\phi_f$ can be obtained under the consideration of the interaction in the channel direction (X direction). Here, $I_D$ is expressed by the following Equation (10), $Q_g$ is expressed by the following Equation (12), $Q_i$ is expressed by the following Equation (13), E is expressed by the following Equation (14), and $Q_{b0}$ is expressed by the following Equation (15).

Here, W is a gate width, • is a mobility of carrier, $Q_i$ is a channel charge density, $Q_g$ a gate charge density, and $Q_{b0}$ is a charge density in inversion layer (bulk) surface.

$$I_D = W\mu Q_i \frac{d\phi_f}{dx} \quad (10)$$

-continued $$Q_g - Q_i + EQ_{b0} = \sqrt{C^2 \frac{N_{sub}}{N_{sub0}}(\beta(\phi_s - V_B) - 1 + \exp(-\beta(\phi_s - V_B))) + EQ_{b0}^2} \quad (11)$$

$$Q_g = C_{ox}(V_G - V_{FB} - \phi_s) \quad (12)$$

$$Q_i = Q_g - \sqrt{Q_g^2 - C^2 \exp(\beta(\phi_s - \phi_f - 2\Phi_B))} \quad (13)$$

$$E = \frac{\varepsilon_{Si} W_{dep}}{Q_{b0}} \frac{d^2 \phi_s}{dx^2} \quad (14)$$

$$Q_{b0} = C \sqrt{\frac{N_{sub}}{N_{sub0}}(\beta(\phi_{s0} - V_B) - 1 + \exp(-\beta(\phi_{s0} - V_B)))} \quad (15)$$

The device characteristic calculating section 202 determines the surface potential $\phi_s$ and the quasi-Fermi level $\phi_f$ to each of the node points 56 and calculates the electric characteristic of the model transistor by utilizing these values.

The determining section 203 compares the transistor electric characteristics calculated by the device characteristic calculating section 202 and the device data 22 to determine whether both the values coincide with each other. When both the values coincide with each other, the determining section 203 stores the temporary model parameter used for calculation of the electric characteristics into the storage unit 13 as a model parameter 24 for the model transistor.

Figure 5:
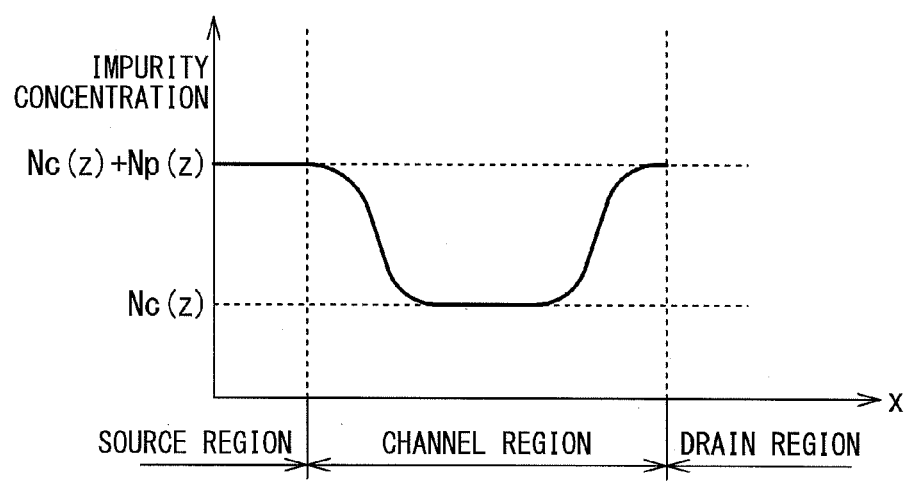
FIG. 5 is a diagram showing one example of an impurity concentration in a channel region.
Figure 6:
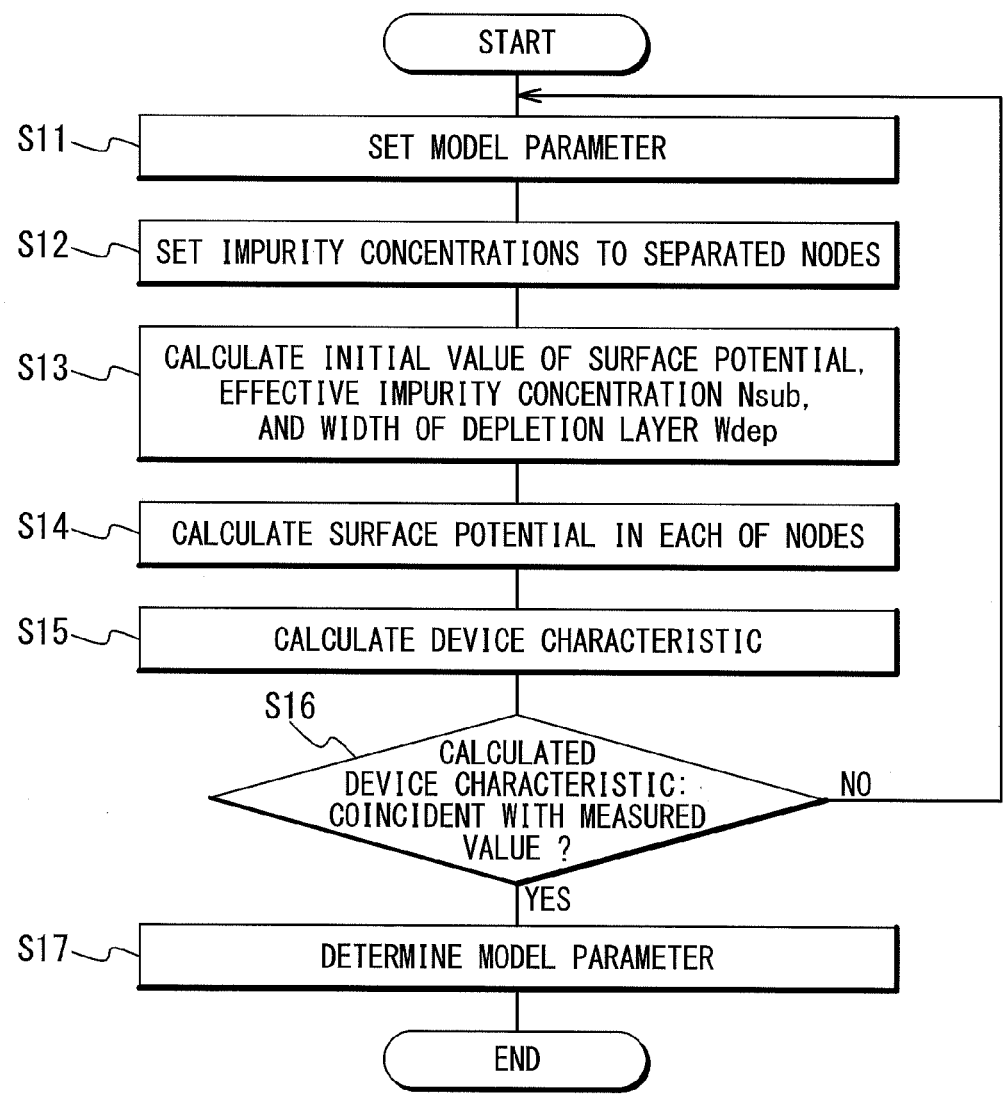
FIG. 6 is a flowchart showing an analysis operation of a device characteristic by the design supporting apparatus according to the first embodiment of the present invention.

Next, referring to FIGS. 4 to 6, an analyzing operation of device characteristics of a transistor in the design supporting apparatus 10 according to the present invention will be described. FIG. 4 is a sectional view of the model transistor and the node points as a calculation target in the device analysis according to the present invention. FIG. 5 is a diagram showing one example of an impurity concentration in a channel region. FIG. 6 is a flowchart showing an analyzing operation of the device characteristics in the first embodiment of the design supporting apparatus 10 according to the present invention.

A method for analyzing device characteristics of a MOS transistor 50 as the model transistor (an analysis target transistor) will be described below. Referring to FIG. 4, the MOS transistor 50 includes the source region 55, the drain region 53, the gate oxide film 52, the channel region 54, and the gate electrode 51. The gate oxide film 52 and the gate electrode 51 are provided on a silicon substrate in this order and the channel region 154 is formed in a region between the source region 155 and the drain region 153 below the gate electrode 151 and the gate oxide film 152. The structure and the manufacturing method of the MOS transistor 50 are specified based on the manufacturing conditions data of the model transistor contained in the condition data 21.

Referring to FIG. 6, first, the design supporting apparatus 10 sets the temporary model parameter as a model parameter according to a data input operation by a user (Step S11). Here, the model parameter setting section 201 discretely generates n node points 56 (n is an integer of at least 2) in the channel region 54 in the channel direction (x direction). Then, assuming that the impurity concentrations N (x, z) are distributed in the channel region 54 to the x direction to meet a Gaussian distribution shown in FIG. 5, $N_c(z)$, $N_p(z)$ and $L_p$ in the Equation (1) are set as the temporary model parameter. It should be noted that the impurity concentrations N(x, z) may be distributed into the z direction to meet a Gaussian distribution. In this case, $N_c(x)$, $N_p(x)$ and $L_p$ are set as the temporary model parameter instead of $N_c(z)$, $N_p(z)$ and $L_p$. Further, the number n of node points 56 may be a number set previously, considering a calculation amount or analysis accuracy, or it may be arbitrarily set by a user. When the analysis accuracy is made high, the number n of node points 56 is increased and when the analyzing time is shortened by reducing the calculation amount, the number n of node points 56 is decreased.

The design supporting apparatus 10 calculates the impurity concentration in each of the node points 56 by using the set temporary model parameter (Step S12). Here, the model parameter setting section 201 calculates the impurity concentrations N(x, z) for every unit depth in each of the node points 56 by using the Equation (1). Thus, the impurity concentrations N(x, z) in the channel region 54 have dimensions of the channel direction and the depth direction and take values to meet the Gaussian distribution (example: the concentration distribution shown in FIG. 5).

Next, the design supporting apparatus 10 calculates the surface potential $\phi_{s0}$, the effective impurity concentration $N_{sub}$, and the depletion layer width $W_{dep}$ by using the calculated impurity concentrations N(x, z) and the condition data 21 corresponding to the MOS transistor 50 (Step S13). Here, the device characteristic calculating section 202 calculates the surface potential $\phi_{s0}$, the effective impurity concentration $N_{sub}$, and the depletion layer width $W_{dep}$ in each of the node points 56 by using the impurity concentrations N(x, z) and solving the Poisson equation of the Equation (2) in the depth direction in the node point 56. In this process, by reducing the dimension of the depth direction (z direction), the impurity concentration for every unit depth in each of the node points 56 is dimension-degenerated (also called "dimension-reduced" or "dimension-compressed") to a surface (a surface of the channel region 54 configuring a boundary with the gate oxide film 52).

Subsequently, the device characteristic calculating section 202 calculates the surface potentials, considering interaction between the node points adjacent to each other by using the surface potentials $\phi_{s0}$ as initial values (Step S14). Since the surface potentials $\phi_{s0}$ calculated at Step S13 are the surface potentials calculated for the respective node points 56, the value considering the interaction with the node points 56 adjacent thereto (or node points 56 existing within a predetermined range) is not obtained. In this process, therefore, by modifying the surface potential in each of the node points 56 while considering the interaction between the node points adjacent to each other, more accurate surface potential $\phi_s$ is determined.

Here, since the interaction between the node points 56 is considered, the quasi two-dimensional Poisson equation (Equation (11)) including the item of $E \cdot Q_{b0}^2$ is used to consider an effect of electric field E and the charge density $Q_{b0}$ on an inversion layer (bulk) surface. Further, it is utilized that a current $I_D$ between the node points 56 adjacent to each other is constant. The device characteristic calculating section 202 solves simultaneous equations of the Equation (10) and the Equation (11) through an iterative calculation method, thereby calculating the surface potential $\phi_s$ and the quasi-Fermi level $\phi_f$ in each of the node points 56 while considering the interaction between the node points.

Subsequently, the device characteristic calculating section 202 calculates the device characteristics by using the calculated surface potentials $\phi_s$ and quasi-Fermi levels $\phi_f$ (Step S15). Here, the electric characteristics of the transistor (e.g. gate capacity $C_{gg}$—gate voltage $V_G$ characteristic and threshold voltage $V_{th}$—substrate voltage $V_B$ characteristic (or drain current $I_D$—substrate voltage $V_B$ characteristic)) are calculated as the device characteristics. Regarding the method for calculating the electric characteristics of the transistor from the surface potentials $\phi_s$, the method described in the non-patent literature 1 or the method described in the non-patent literature 2 can be used. At this time, the device characteristic calculating section 202 calculates the electric characteristics based upon the condition data 21 containing the manufacturing conditions data of the MOS transistor 50.

When the device characteristics are calculated by the device characteristic calculating section 202, the determining section 203 compares the device characteristic data 22 (measured values) corresponding to the MOS transistor 50 and the device characteristics calculated at Step S15 with each other to determine whether or not they coincide with each other within a predetermined range (Step S16). When the calculated data of the device characteristics and the device characteristic data 22 do not coincide with each other within the predetermined range, the control flow advances to the Step S11 in which the temporary model parameter is changed and the above-mentioned operation (Steps S11 to S16) is repeated (Step S16: No). On the other hand, when the calculated data of the device characteristics and the device characteristic data 22 coincide with each other within the predetermined range, the temporary model parameter set at the Step S11 is determined as the model parameter 24 of the MOS transistor 50 and are stored in the storage unit 13 in association with a data specifying the MOS transistor 50 (Step S16: Yes, S17). Here, the model parameter to be stored may contain $N_c(z)$, $N_p(z)$, and $L_p$ set as the temporary model parameter or they may be impurity concentrations $N(x, z)$ calculated by using the temporary model parameter $N_c(z)$, $N_p(z)$, and $L_p$. When $N_c(z)$, $N_p(z)$, and $L_p$ are stored as the model parameter 24, a data amount to be stored becomes small. On the other hand, when the impurity concentration $N(x, z)$ in each of the node points 56 is recorded as the model parameter 24, the data amount becomes large, but when design or analysis of a transistor is performed by utilizing the model parameter 24, a process for calculating the impurity concentrations $N(x, z)$ can be omitted so that a designing time or analyzing time can be shortened. Further, when model parameter 24 is determined, the device characteristic calculating section 202 can store the data about the electric characteristics of the transistor obtained from the model parameter in association with the condition data 21 (the manufacturing conditions data of the transistor) in the storage unit 13.

As described above, in the present invention, the impurity concentrations in the depth direction in the node points which are arranged discretely in the channel direction are calculated according to an actual concentration distribution, and these data are degenerated to the surface potentials by utilizing the impurity concentrations. Therefore, the calculation amount can be reduced as compared with a method is performed in which the channel region 54 is discretely divided in the channel direction and in the depth direction and the calculation. Since the calculation amount required for the analysis is reduced, the number n of node points can be increased and the number of parameters of the model parameter which can be obtained can be increased. Further, the surface potential $\phi_s$ is calculated while considering the interaction between the node points 56, and an error between the surface potential $\phi_s$ and the surface potential in the actual transistor is decreased. Therefore, the highly accurate model parameter or the device characteristics can be obtained.

Figure 7:
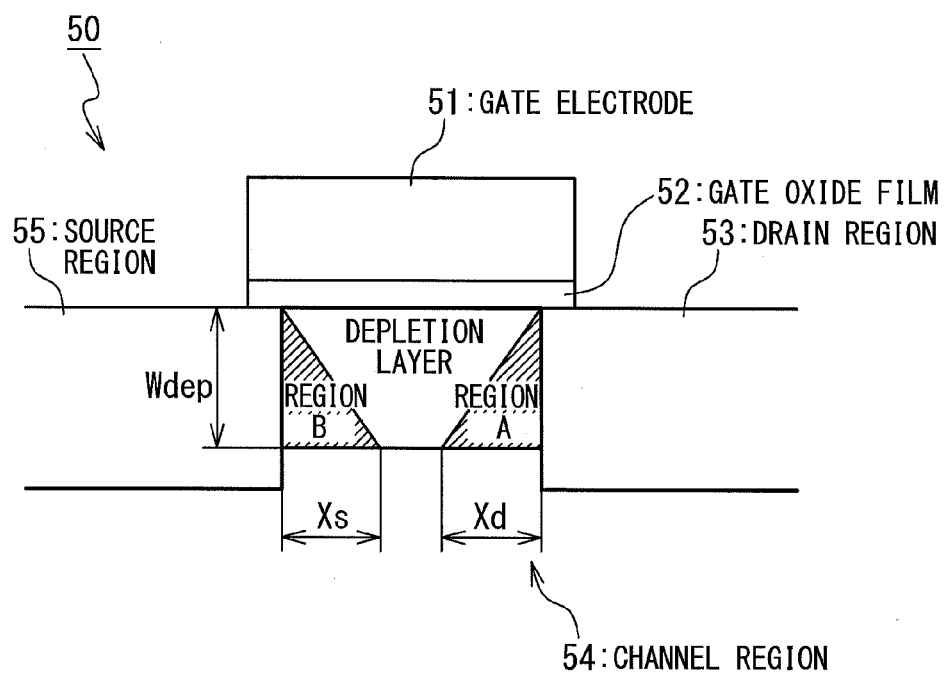
FIG. 7 is a sectional view of the model transistor for explaining a short channel effect in the channel region.

In order to further improve the accuracy of the model parameter or the device characteristics to be calculated, it is preferable that the surface potentials $\phi_s$ are calculated while considering the short channel effect. For example, as shown in FIG. 7, since a distance between the drain region 53 and the source region 55 becomes shorter according to reduction of the gate length $L_{gate}$, the charge amounts in approximate regions A and B to these source and drain regions fluctuate. By correcting the fluctuation amounts, it is made possible to calculate the surface potentials $\phi_s$ while considering the short channel effect. Here, the charges of the region A on the side of the drain region 53 and of the region B on the side of the source region 54 are corrected so as to be •E×$Q_{b0}$. Therefore, the electric field E is expressed by the following Equation (16) in which a correction term •E by considering the short channel effect is added to the electric field E shown by the Equation (14). It should be noted that •E is expressed by the following Equation (17). Here, the lengths of the regions A and B (in the X direction) at the position of the depletion layer width $W_{dep}$ from the surface (the boundary with the gate oxide film 52) of the channel region 54 are represented by $X_d$ and $X_s$. In this case, $$E = \frac{\varepsilon_{Si} W_{dep}}{Q_{b0}} \frac{d^2 \phi_s}{dx^2} + \Delta E \tag{16}$$

$$\Delta E = \max\left(1 - \frac{x}{X_s}, 0\right) + \max\left(1 - \frac{L_{gate} - x}{X_d}, 0\right) \tag{17}$$

Thus, according to the present invention, the short channel effect can be reproduced with high accuracy, and analysis of a semiconductor device in which an error has been reduced becomes possible.

[Second Embodiment]

The design supporting apparatus 10 according to a second embodiment of the present invention will be described with reference to FIGS. 8 and 9. The design supporting apparatus 10 in the second embodiment performs a device design (circuit design) of transistors or the like, by using the model parameter 24 obtained in the first embodiment. A configuration of the design supporting apparatus 10 in the second embodiment is similar to that shown in FIG. 2, but a configuration of the design support program 23 is changed from that of the first embodiment. A configuration and an operation which are different from those of the first embodiment will be described below. The remaining configuration and operation are similar to those of the first embodiment, and therefore the double description is omitted.

Figure 8:
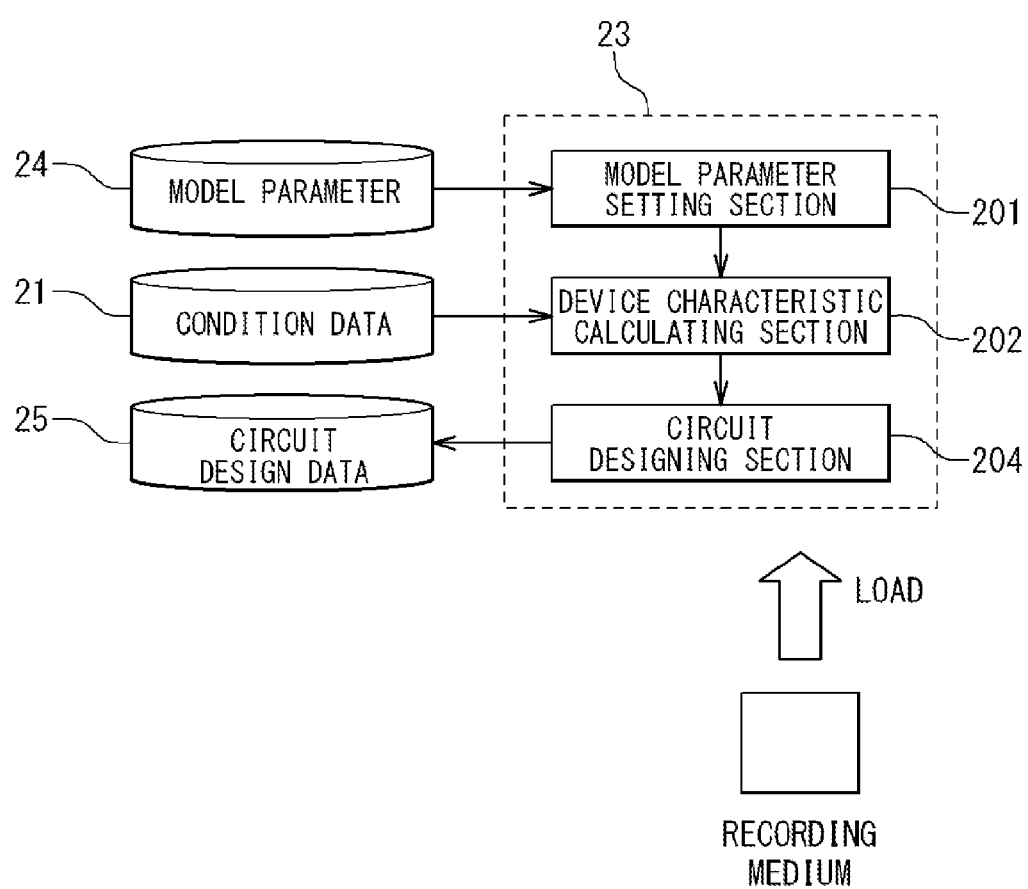
FIG. 8 is a functional block diagram showing a configuration of the design supporting apparatus according to a second embodiment of the present invention.

FIG. 8 is a functional block diagram showing the design supporting apparatus according to the second embodiment of the present invention. The CPU 11 in the second embodiment executes the design support program 23, to realize functions of the model parameter setting section 201, the device characteristic calculating section 202 and a circuit designing section 204 shown in FIG. 8.

The model parameter setting section 201 in the second embodiment calculates impurity concentration $N(x, z)$ in each of the node points 56 by using the model parameter determined by the first embodiment. The device characteristic calculating section 202 executes a process similar to that in the first embodiment by utilizing the condition data 21 of a design target device to calculate device characteristics (electric characteristics) of the design target device. The circuit designing section 204 designs the device (for example, a transistor) by utilizing the device characteristics calculated from the device characteristic calculating section 202. A data about the designed device is stored in the storage unit 13 as the circuit design data 25.

Figure 9:
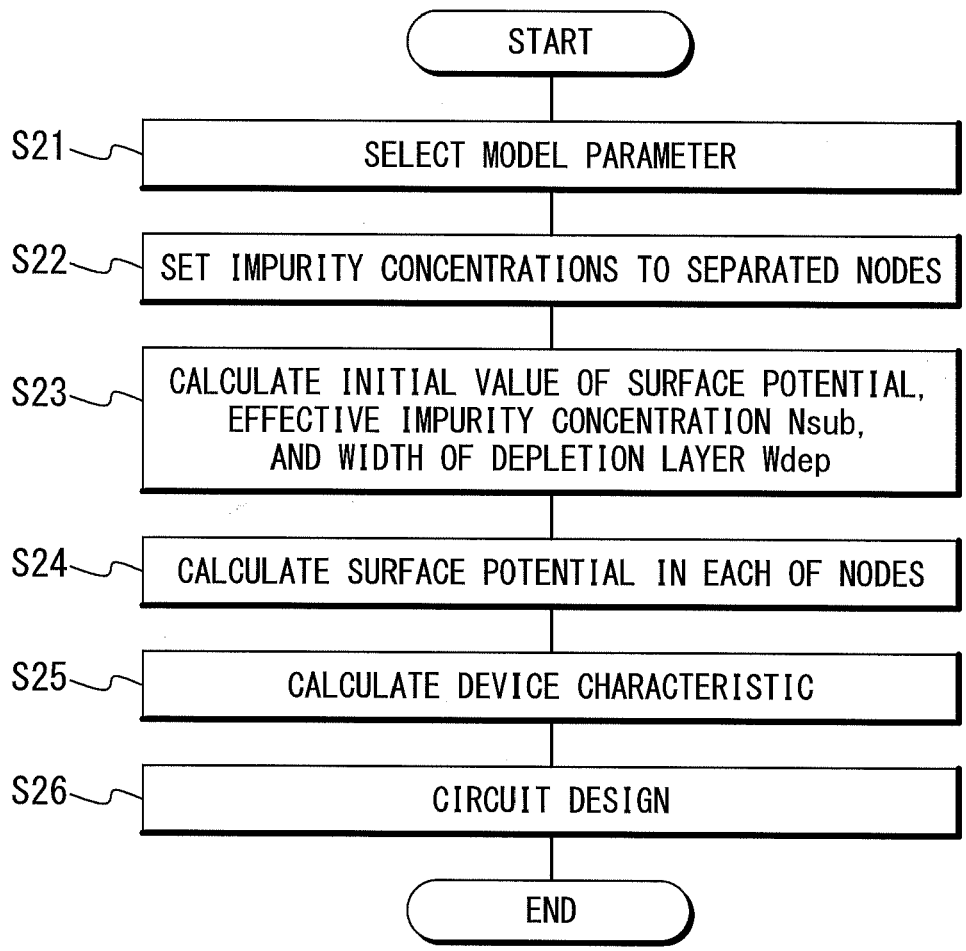
FIG. 9 is a flowchart showing a circuit design operation by the design supporting apparatus according to the second embodiment of the present invention.

FIG. 9 is a flowchart showing a circuit designing operation of the design supporting apparatus 10 according to the second embodiment of the present invention. An operation of the second embodiment of the design supporting apparatus 10 according to the present invention will be described with reference to FIG. 9.

First, the design supporting apparatus 10 selects a model parameter 24 corresponding to a design target device (circuit) (Step S21). Here, when the model parameter contains $N_c(z)$, $N_p(z)$, and $L_p$, the model parameter setting section 201 calculates impurity concentrations $N(x, z)$ for respective node points 56 discretely arranged by using the selected model parameter 24, like the first embodiment (Step S22). Alternatively, when the model parameter 24 contains the impurity concentrations $N(x, z)$ in the respective node points 56, the model parameter setting section 201 outputs the selected impurity concentrations $N(x, z)$ to the device characteristic calculating section 202.

The device characteristic calculating section 202 calculates a surface potential $\phi_{s0}$, an effective impurity concentration $N_{sub}$, a depletion layer width $W_{dep}$ in each of the node points 56 by using the condition data 21 corresponding to the design target device (circuit) and the impurity concentrations $N(x, z)$ set at the Step S21 (Step S23). Next, the device characteristic calculating section 202 calculates the surface potential by utilizing the surface potential $\phi_{s0}$ as an initial value and considering interaction between the node points adjacent to each other (Step S24). Subsequently, the device characteristic calculating section 202 calculates the device characteristics by using the surface potentials $\phi_s$ and the quasi-Fermi levels $\phi_f$ (Step S25). It should be noted that the process in the Steps S23 to S25 is similar to that in the first embodiment.

Here, when the device characteristics of the design target device (circuit) are previously stored in the storage unit 13 according to the analyzing process in the first embodiment, the process in the Step S21 to S25 can be omitted.

The circuit designing section 204 performs circuit design by using the calculated device characteristics (Step S26). The design of the circuit is exemplified, for example, in logical design such as architecture design, logical circuit design, and transistor circuit design (basic circuit design), or layout design such as floor planning/arrangement/wiring and layout verification. The result of circuit design is stored in the storage unit 13 as circuit design data 25.

According to the present invention, since it is possible to determine surface potentials accurately in accordance with a channel impurity concentration distribution, electric characteristics of a transistor can be reproduced with high accuracy without depending on a bias condition, and design of a semiconductor circuit with reduction in error is possible.

[Third Embodiment]

The design supporting apparatus 10 according to a third embodiment of the present invention will be described with reference to FIGS. 10 and 11. The design supporting apparatus 10 in the third embodiment performs analysis of a device by using a model parameter 24 obtained in the first embodiment and considering a manufacturing variation. A configuration of the design supporting apparatus 10 in the third embodiment is similar to that shown in FIG. 2, but a configuration of a design support program 23 is changed from that in the first embodiment. A configuration and an operation of the third embodiment different from those of the first embodiment will be described below. Explanation of the remaining configuration and operation similar to those of the first embodiment is omitted.

Figure 10:
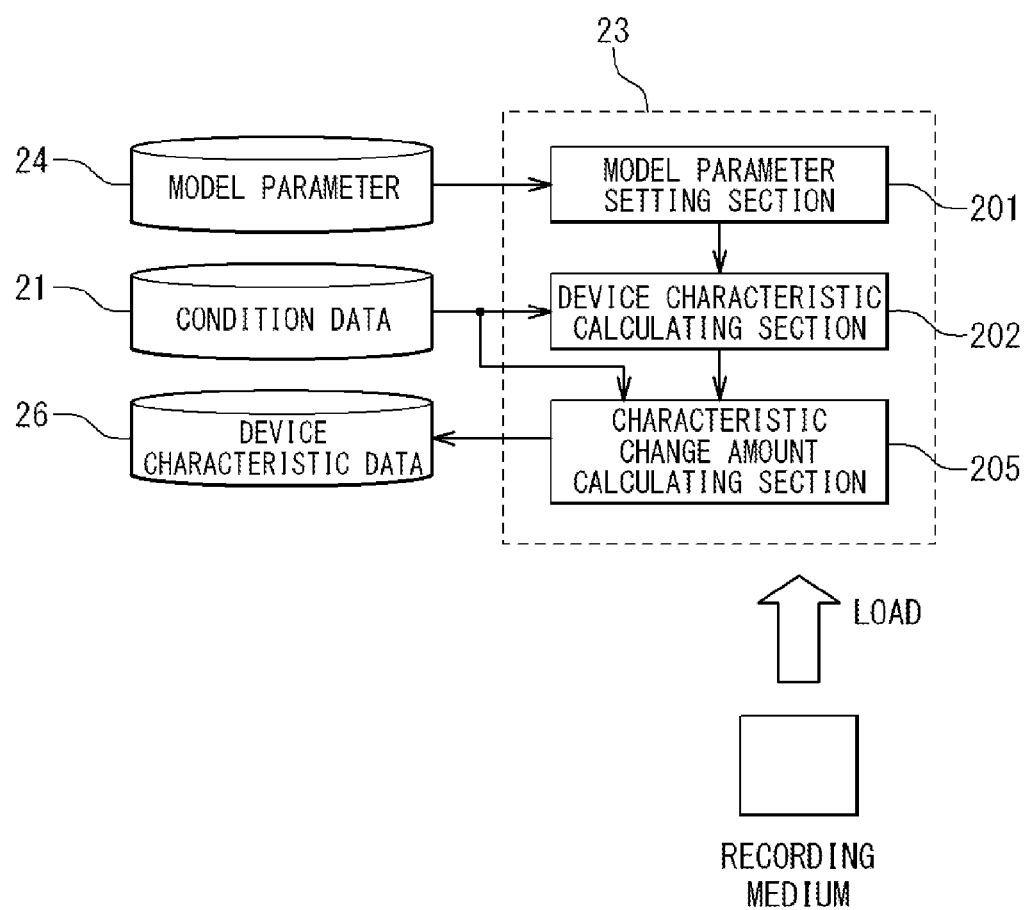
FIG. 10 is a functional block diagram showing a configuration of the design supporting apparatus according to a third embodiment of the present invention.

FIG. 10 is a functional block diagram in the third embodiment of the design supporting apparatus according to the present invention. The CPU 11 in the third embodiment executes the design support program 23, to realize functions of the model parameter setting section 201, the device characteristic calculating section 202, and a characteristic change amount calculating section 205.

The model parameter setting section 201 in the third embodiment calculates impurity concentration $N(x, z)$ in each of the node points 56 by using the model parameter 24 determined by the first embodiment. The device characteristic calculating section 202 calculates device characteristics (electric characteristics) of a design target device by a process similar to that in the first embodiment by utilizing the condition data 21 of the design target device. The device characteristic change amount calculating section 205 simulates a change amount of the device characteristic (electric characteristic of a transistor) when a channel impurity concentration has been changed due to manufacturing variation. The simulation result is stored in the storage unit 13 as device characteristic data 26.

Figure 11:
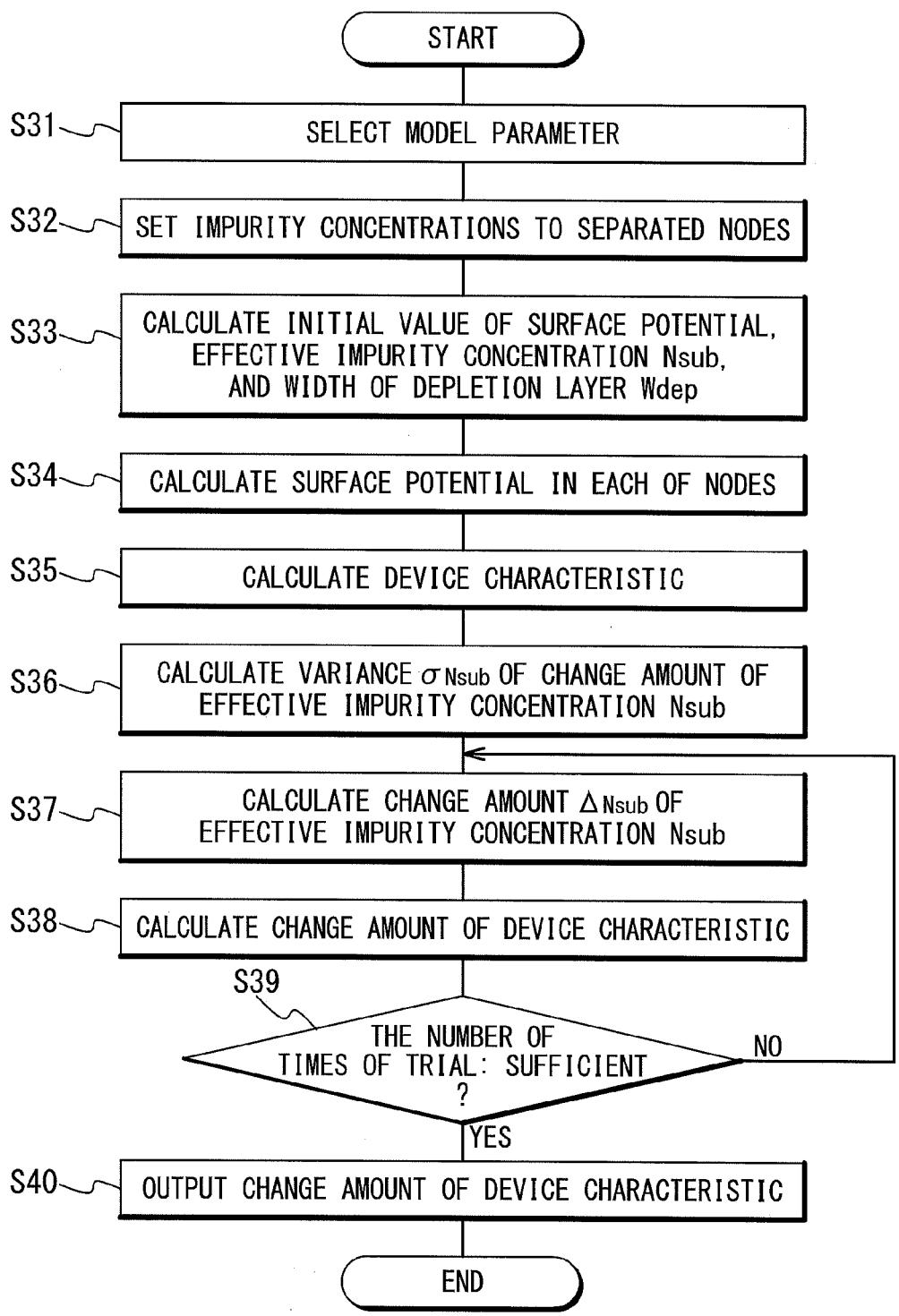
FIG. 11 is a flowchart showing a device characteristic simulation operation by the design supporting apparatus according to the third embodiment of the present invention.

FIG. 11 is a flowchart showing a circuit design operation of the design supporting apparatus 10 according to the third embodiment of the present invention. An operation of the design supporting apparatus 10 according to the third embodiment of the present invention will be described with reference to FIG. 11.

First, the design supporting apparatus 10 selects a model parameter 24 corresponding to a design target device (circuit) (Step S31). Here, when the model parameter contains $N_c(z)$, $N_p(z)$, and $L_p$, the model parameter setting section 201 calculates impurity concentrations $N(x, z)$ for the respective node points 56 arranged discretely, by using the model parameter 24, like the first embodiment (Step S32). Alternatively, when the model parameter 24 contains the impurity concentrations $N(x, z)$ in the respective node points 56, the model parameter setting section 201 outputs the selected impurity concentrations $N(x, z)$ to the device characteristic calculating section 202.

The device characteristic calculating section 202 calculates a surface potential $\phi_{s0}$, an effective impurity concentration $N_{sub}$, and a depletion layer width $W_{dep}$ in each of the node points 56 by using the condition data 21 corresponding to the design target device (circuit) and the impurity concentrations $N(x, z)$ set at the Step S21 (Step S33). Next, the device characteristic calculating section 202 calculates a surface potential by utilizing the surface potential $\phi_{s0}$ as an initial value and considering interaction between the node points adjacent to each other (Step S34). Subsequently, the device characteristic calculating section 202 calculates device characteristics by using the calculated surface potentials $\phi_s$ and quasi-Fermi levels $\phi_f$ (Step S35). It should be noted that a process in the Steps S33 to S35 is similar to that in the first embodiment.

Here, when the device characteristics of the design target device (circuit) are previously stored in the storage unit 13 in accordance with the analyzing process in the first embodiment, the process in the Step S31 to S35 can be omitted.

When the effective impurity concentration $N_{sub}$ and the depletion layer width $W_{dep}$ are calculated at Step S33, the device characteristic change amount calculating section 205 analyses a change amount of a transistor electric characteristic changed due to manufacturing variation (Step S36 to S39). Specifically, when representing the widths of the regions in the x direction in the respective node points 56 as •x, the device characteristic change amount calculating section 205 calculates variance •$_{Nsub}$ of a change amount of the effective impurity concentration $N_{sub}$ based on the following Equation (18) (Step S36). It should be noted that $W^*_{dep}$ is expressed by the following Equation (19).

$$\sigma_{Nsub} = \sqrt{\frac{4}{\Delta x W_{gate} W_{dep}^{*4}} \int_0^{W_{dep}} z^2 N(x,z) dz} \quad (18)$$

$$W_{dep}^* = \frac{1}{N_{sub}} \int_0^{W_{dep}} N(x,z) dz \quad (19)$$

Next, the device characteristic change amount calculating section 205 generates normal random numbers R to the respective node points 56 and calculates a product (the following Equation (20)) of the normal random number R and the variance •N$_{sub}$ as the change amount •N$_{sub}$ of the effective impurity concentration in each of the node points 56 (Step S37).

$$\Delta N_{sub} = R\sigma_{Nsub} \quad (20)$$

Subsequently, the device characteristic change amount calculating section 205 calculates a change amount of the device characteristic due to manufacturing variation (Step S38). Specifically, the device characteristic change amount calculating section 205 calculates a device characteristic (transistor characteristic) of an analysis target device (circuit) by utilizing impurity concentrations obtained by adding the change amount •N$_{sub}$ to the effective impurity concentrations N$_{sub}$ as the effective impurity concentrations in the respective node points 56. A calculating method of the device characteristic is similar to that in the first embodiment except that the effective impurity concentrations to be used are different. The device characteristic change amount calculating section 205 outputs a difference between the transistor characteristic obtained while considering the change amount •N$_{sub}$ of the impurity concentrations and the transistor characteristic obtained in the Step S35 as a change amount of the transistor characteristic.

The device characteristic change amount calculating section 205 repeats the process from the Step S37 to the Step S38 until a sufficient number of times of trial (the threshold) is obtained (Step S39: No). The device characteristic change amount calculating section 205 stores the calculated change amount of the device characteristic in the storage unit 13 as device characteristic data 26 in association with the analysis target device (circuit) when the number of times of the calculation of the change amount of the device characteristic due to the manufacturing variation reaches a sufficient number of times of trial (the threshold) (Step S39: Yes, S40). At this time, it is preferable that a change range indicating an upper limit and a lower limit of the change amount is stored as the device characteristic data 26.

In the conventional method, since it was impossible to calculate the impurity concentration distribution in the channel region accurately, the channel impurity concentration is changed due to manufacturing variation, so that a variation of the transistor characteristic cannot be analyzed with high accuracy. On the other hand, in the present invention, since the change amount of the effective channel impurity concentration can be obtained in accordance with the channel impurity concentration distribution, it is possible to calculate accurately a change amount of the transistor characteristic obtained when the channel impurity concentration has been changed.

As described above, in the present invention, the impurity concentrations in the channel direction and in the depth direction are calculated in accordance with the actual concentration distribution rule, and the electric characteristics of the transistor are calculated by using the surface potentials $\phi$s0 calculated by degenerating the impurity concentrations on a surface of the channel region. Therefore, the electric characteristic with high accuracy can be obtained. Further, in the present invention, the surface potentials $\phi_s$ and quasi-Fermi levels $\phi_f$ are calculated based upon the surface potentials $\phi_{s0}$ of the respective node points 56 arranged discretely in the channel direction and by considering interaction between the node points 56 adjacent to each other, and the transistor electric characteristics are calculated using these values. Therefore, an actual transistor characteristic can be reproduced with higher accuracy.

According to the present invention, since the surface potentials can be obtained accurately in accordance with the channel impurity concentration distribution, the electric characteristics of a transistor can be reproduced without depending on the bias condition. Further, an actual channel impurity concentration distribution can be estimated from the calculated electrical characteristics of the transistor. The design supporting apparatus 10 according to the present invention can perform circuit design with precision higher than that of the conventional one, and simulation of the electric characteristic (verification of characteristic variations) by using the model parameter (impurity concentrations) obtained by analysis as described above.

Further, in the present invention, since it is unnecessary to perform discretization of the concentration in the depth direction to conduct calculation, the calculation amount is reduced so that analysis of electric characteristics with high precision can be performed at high speed.

Though the embodiments of the present invention have been described in detail above, a specific configuration is not limited to the above embodiments, and a modification which does not depart from the gist of the present invention is included in the present invention. The design supporting apparatuses 10 and the analyzing/designing methods from the first embodiment to the third embodiment may be combined within a technically-feasible scope. For example, a process from the generation of the model parameter 24 to the circuit design or the device analysis can be executed by one apparatus, or a plurality of processes may be executed by a plurality of apparatuses. Further, in the above-mentioned embodiments, explanation has been made, assuming that the impurities concentration distribution depends on a Gaussian distribution, but the temporary model parameter can be set assuming that the concentration distribution depends on another distribution rule.

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:

1. A method of analyzing a semiconductor device, comprising:
    setting an impurity concentration with respect to a channel direction and a depth direction to node points arranged discretely in a channel region of a model transistor based on a predetermined concentration distribution rule;
    calculating a surface potential to each of said node points by reducing a dimension of said impurity concentration in the depth direction;
    correcting the surface potential based on interaction between said node points adjacent to each other to generate the corrected surface potential;
    calculating an electric characteristic of said model transistor by using the corrected surface potential; and storing said impurity concentration as a model parameter of said model transistor in a storage unit, when the calculated electric characteristic and an electric characteristic prepared previously are coincident with each other within a predetermined range, wherein said calculating a surface potential comprises:

calculating the surface potential to each of said node points by solving a Poisson equation in the depth direction on said node point, wherein the Poisson equation is expressed by the following equation:

$$C_{ox}(V_G - V_{FB} - \phi_{s0}) = C$$
$$\sqrt{\frac{N_{sub}}{N_{sub0}}(\beta(\phi_{s0} - V) - 1 + \exp(-\beta(\phi_{s0} - V_B))) + \exp(\beta(\phi_{s0} - \phi_f - 2\Phi_B))}$$

where $\phi_{s0}$ is the surface potential, $V_G$ is a gate voltage, $V_{FB}$ is a flat band voltage, $V_B$ is a substrate voltage, $N_{sub0}$ is an effective impurity concentration on a surface in the channel region, $\Phi_B$ is an energy difference between a quasi-Fermi level and an intrinsic Fermi level, $\phi_f$ is the quasi-Fermi level, $\epsilon_{ox}$ is a dielectric constant of a gate oxide film, $T_{ox}$ is a film thickness of the gate oxide film, q is an elementary charge amount, $\epsilon_{si}$ is a dielectric constant of silicon, $\beta$ is a thermal voltage, $k_B$ is the Boltzmann constant, T is an absolute temperature on an operation, $n_i$ is an intrinsic carrier density, and N(x, z) expresses said impurity concentration set to each node point, wherein the following equations are met, $$C_{ox} = \frac{\varepsilon_{ox}}{T_{ox}}$$

$$C = \sqrt{\frac{2\varepsilon_{Si} q N_{sub0}}{\beta}}$$

$$\Phi_B = \frac{1}{\beta} \log\left(\frac{N_{sub0}}{n_i}\right)$$

$$\beta = \frac{q}{k_B T}$$

$$\phi_{s0} = \frac{q}{\varepsilon_{Si}} \int_0^{W_{dep}} N(x, z) z \, dz + \frac{1}{\beta} + V_B$$

$$N_{sub} = \frac{\left(\int_0^{W_{dep}} N(x, z) dz\right)^2}{2 \int_0^{W_{dep}} N(x, z) z \, dz}$$

$$N_{sub0} = N(x, 0).$$

2. The method according to claim 1, wherein said correcting the surface potential comprises:

calculating the corrected surface potential based on the interaction, by solving simultaneous equations of a quasi 2-dimensional Poisson equation based on a charge density in an inversion layer surface and a current continuation equation indicating that a current between the node points is constant, through an iterative calculation method by using the surface potential as an initial value, wherein when W is a gate width, μ is a mobility of carrier, and $Q_i$ is a channel charge density, the current $I_D$ is expressed by the following equation:

$$I_D = W \mu Q_i \frac{d\phi_f}{dx}$$

wherein when $\phi_s$ is the corrected surface potential, $Q_g$ a gate charge density, and $Q_{b0}$ is a charge density in the inversion layer surface, the quasi 2-dimensional Poisson equation is expressed by the following equation:

$$Q_g - Q_i + EQ_{b0} = \sqrt{C^2 \frac{N_{sub}}{N_{sub0}}(\beta(\phi_s - V_B) - 1 + \exp(-\beta(\phi_s - V_B))) + EQ_{b0}^2}$$

here, the following equations are met:

$$Q_g = C_{ox}(V_G - V_{FB} - \phi_s)$$

$$Q_i = Q_g - \sqrt{Q_g^2 - C^2 \exp(\beta(\phi_s - \phi_f - 2\Phi_B))}$$

$$E = \frac{\varepsilon_{Si} W_{dep}}{Q_{b0}} \frac{d^2 \phi_s}{dx^2}$$

$$Q_{b0} = C \sqrt{\frac{N_{sub}}{N_{sub0}}(\beta(\phi_{s0} - V_B) - 1 + \exp(-\beta(\phi_{s0} - V_B)))} .$$

3. The method according to claim 1, wherein said correcting the surface potential comprises:

calculating the corrected surface potential based on the interaction, by solving simultaneous equations of a quasi 2-dimensional Poisson equation based on a charge density in an inversion layer surface and a current continuation equation indicating that a current between the node points is constant, by an iterative calculation method by using the surface potential as an initial value, wherein when W is a gate width, μ is a mobility of carrier, and $Q_i$ is a channel charge density, the current $I_D$ is expressed by the following equation:

$$I_D = W \mu Q_i \frac{d\phi_f}{dx}$$

wherein when $\phi_s$ is the corrected surface potential, $Q_g$ a gate charge density, $Q_{b0}$ is a charge density in the inversion layer surface, and ΔE is a correction term for a short channel effect, the quasi 2-dimensional Poisson equation is expressed by the following equation:

$$Q_g - Q_i + EQ_{b0} = \sqrt{C^2 \frac{N_{sub}}{N_{sub0}}\left(\begin{array}{c}\beta(\phi_s - V_B) - 1 + \\ \exp(-\beta(\phi_s - V_B))\end{array}\right) + EQ_{b0}^2}$$

here, the following equations are met:

$$Q_g = C_{ox}(V_G - V_{FB} - \phi_s)$$

$$Q_i = Q_g - \sqrt{Q_g^2 - C^2 \exp(\beta(\phi_s - \phi_f - 2\Phi_B))}$$

$$E = \frac{\varepsilon_{Si} W_{dep}}{Q_{b0}} \frac{d^2 \phi_s}{dx^2} + \Delta E$$

-continued $$Q_{b0} = C\sqrt{\frac{N_{sub}}{N_{sub0}}(\beta(\phi_{s0} - V_B) - 1 + \exp(-\beta(\phi_{s0} - V_B)))}.$$

4. The method according to claim 3, wherein when a distance from an end of a drain region in said channel region is $X_d$ and a distance from an end of a source region in said channel region is $X_s$, said correction term is expressed by the following equation:

$$\Delta E = \max\left(1 - \frac{x}{X_s}, 0\right) + \max\left(1 - \frac{L_{gate} - x}{X_d}, 0\right).$$

5. A design supporting apparatus of a semiconductor device, comprising:
a model parameter setting section configured to set an impurity concentration with respect to a channel direction and a depth direction to node points arranged discretely in a channel region of a model transistor based on a predetermined concentration distribution rule;
a device characteristic calculating section configured to calculate an electric characteristic of said model transistor by using said impurity concentration; and
a determining section configured to store said impurity concentration as a model parameter of said model transistor in a storage unit, when the calculated electric characteristic and an electric characteristic prepared previously are coincident with each other within a predetermined range,
wherein said device characteristic calculating section calculates a surface potential to each of said node points by reducing a dimension of said impurity concentration in the depth direction, corrects the surface potential based on interaction between said node points adjacent to each other to generate the corrected surface potential, and calculates the electric characteristic of said model transistor by using the corrected surface potential,
wherein said device characteristic calculating section calculating the surface potential to each of said node points by solving a Poisson equation in the depth direction on said node point,
wherein a surface potential the Poisson equation is expressed by the following equation:

$$C_{ox}(V_G - V_{FB} - \phi_{s0}) = C$$

$$\sqrt{\frac{N_{sub}}{N_{sub0}}(\beta(\phi_{s0} - V) - 1 + \exp(-\beta(\phi_{s0} - V_B))) + \exp(\beta(\phi_{s0} - \phi_f - 2\Phi_B))}$$

where $\phi_{s0}$ is the surface potential, $V_G$ is a gate voltage, $V_{FB}$ is a flat band voltage, $V_B$ is a substrate voltage, $N_{sub0}$ is an effective impurity concentration on a surface in the channel region, $\Phi_B$ is an energy difference between a quasi-Fermi level and an intrinsic Fermi level, $\phi_f$ is the quasi-Fermi level, $\in_{ox}$ is a dielectric constant of a gate oxide film, $T_{ox}$ is a film thickness of the gate oxide film, q is an elementary charge amount, $\in_{Si}$ is a dielectric constant of silicon, $\beta$ is a thermal voltage, $k_B$ is the Boltzmann constant, T is an absolute temperature on an operation, $n_i$ is an intrinsic carrier density, and N(x, z) expresses said impurity concentration set to each node point, wherein the following equations are met, $$C_{ox} = \frac{\varepsilon_{ox}}{T_{ox}}$$

$$C = \sqrt{\frac{2\varepsilon_{Si} q N_{sub0}}{\beta}}$$

$$\Phi_B = \frac{1}{\beta}\log\left(\frac{N_{sub0}}{n_i}\right)$$

$$\beta = \frac{q}{k_B T}$$

$$\phi_{s0} = \frac{q}{\varepsilon_{Si}} \int_0^{W_{dep}} N(x, z) z \, dz + \frac{1}{\beta} + V_B$$

$$N_{sub} = \frac{\left(\int_0^{W_{dep}} N(x, z) dz\right)^2}{2 \int_0^{W_{dep}} N(x, z) z \, dz}$$

$$N_{sub0} = N(x, 0).$$

6. The design supporting apparatus according to claim 5, wherein said device characteristic calculating section calculates the corrected surface potential based on the interaction, by solving simultaneous equations of a quasi 2-dimensional Poisson equation based on a charge density in an inversion layer surface and a current continuation equation indicating that a current between the node points is constant, through an iterative calculation method by using the surface potential as an initial value,
wherein when W is a gate width, μ is a mobility of carrier, and $Q_i$ is a channel charge density, the current $I_D$ is expressed by the following equation:

$$I_D = W\mu Q_i \frac{d\phi_f}{dx}$$

wherein when $\phi_s$ is the corrected surface potential, $Q_g$ a gate charge density, and $Q_{b0}$ is a charge density in the inversion layer surface, the quasi 2-dimensional Poisson equation is expressed by the following equation:

$$Q_g - Q_i + EQ_{b0} = \sqrt{C^2 \frac{N_{sub}}{N_{sub0}}(\beta(\phi_s - V_B) - 1 + \exp(-\beta(\phi_s - V_B))) + EQ_{b0}^2}$$

here, the following equations are met:

$$Q_g = C_{ox}(V_G - V_{FB} - \phi_s)$$

$$Q_i = Q_g - \sqrt{Q_g^2 - C^2 \exp(\beta(\phi_s - \phi_f - 2\Phi_B))}$$

$$E = \frac{\varepsilon_{Si} W_{dep}}{Q_{b0}} \frac{d^2 \phi_s}{dx^2}$$

$$Q_{b0} = C\sqrt{\frac{N_{sub}}{N_{sub0}}(\beta(\phi_{s0} - V_B) - 1 + \exp(-\beta(\phi_{s0} - V_B)))}.$$

7. The design supporting apparatus according to claim 5, wherein said device characteristic calculating section calculates the corrected surface potential based on the interaction, by solving simultaneous equations of a quasi 2-dimensional Poisson equation based on a charge density in an inversion layer surface and a current continuation equation indicating that a current between the node points is constant, through an iterative calculation method by using the surface potential as an initial value, wherein when W is a gate width, μ is a mobility of carrier, and $Q_i$ is a channel charge density, the current $I_D$ is expressed by the following equation:

$$I_D = W\mu Q_i \frac{d\phi_f}{dx}$$

wherein when $\phi_s$ is the corrected surface potential, $Q_g$ a gate charge density, $Q_{b0}$ is a charge density in the inversion layer surface, and $\Delta E$ is a correction term for a short channel effect, the quasi 2-dimensional Poisson equation is expressed by the following equation:

$$Q_g - Q_i + EQ_{b0} = \sqrt{C^2 \frac{N_{sub}}{N_{sub0}}(\beta(\phi_s - V_B) - 1 + \exp(-\beta(\phi_s - V_B))) + EQ_{b0}^2}$$

here, the following equations are met:

$$Q_g = C_{ox}(V_G - V_{FB} - \phi_s)$$

$$Q_i = Q_g - \sqrt{Q_g^2 - C^2\exp(\beta(\phi_s - \phi_f - 2\Phi_B))}$$

$$E = \frac{\varepsilon_{Si} W_{dep}}{Q_{b0}} \frac{d^2\phi_s}{dx^2} + \Delta E$$

$$Q_{b0} = C\sqrt{\frac{N_{sub}}{N_{sub0}}(\beta(\phi_{s0} - V_B) - 1 + \exp(-\beta(\phi_{s0} - V_B)))}.$$

8. The design supporting apparatus according to claim 7, wherein when a distance from an end of a drain region in said channel region is $X_d$ and a distance from an end of a source region in said channel region is $X_S$, said correction term is expressed by the following equation:

$$\Delta E = \max\left(1 - \frac{x}{X_s}, 0\right) + \max\left(1 - \frac{L_{gate} - x}{X_d}, 0\right).$$

9. A non-transient computer-readable recording medium in which a computer-executable program code is stored to attain an analyzing method of a semiconductor device, which said analyzing method comprises:

setting an impurity concentration with respect to a channel direction and a depth direction to node points arranged discretely in a channel region of a model transistor based on a predetermined concentration distribution rule;

calculating a surface potential to each of said node points by reducing a dimension of said impurity concentration in the depth direction;

correcting the surface potential based on interaction between said node points adjacent to each other to generate the corrected surface potential;

calculating an electric characteristic of said model transistor by using the corrected surface potential; and storing said impurity concentration as a model parameter of said model transistor in a storage unit, when the calculated electric characteristic and an electric characteristic prepared previously are coincident with each other within a predetermined range, wherein said calculating a surface potential comprises:

calculating the surface potential to each of said node points by solving a Poisson equation in the depth direction on said node point, wherein the Poisson equation is expressed by the following equation:

$$C_{ox}(V_G - V_{FB} - \phi_{s0}) =$$
$$C\sqrt{\frac{N_{sub}}{N_{sub0}}(\beta(\phi_{s0} - V) - 1 + \exp(-\beta(\phi_{s0} - V_B))) + \exp(\beta(\phi_{s0} - \phi_f - 2\Phi_B))}$$

where $\phi_{s0}$ is the surface potential, $V_G$ is a gate voltage, $V_{FB}$ is a flat band voltage, $V_B$ is a substrate voltage, $N_{sub0}$ is an effective impurity concentration on a surface in the channel region, $\Phi_B$ is an energy difference between a quasi-Fermi level and an intrinsic Fermi level, $\phi_f$ is the quasi-Fermi level, $\varepsilon_{ox}$ is a dielectric constant of a gate oxide film, $T_{ox}$ is a film thickness of the gate oxide film, q is an elementary charge amount, $\varepsilon_{Si}$ is a dielectric constant of silicon, β is a thermal voltage, $k_B$ is the Boltzmann constant, T is an absolute temperature on an operation, $n_i$ is an intrinsic carrier density, and N(x, z) expresses said impurity concentration set to each node point, wherein the following equations are met, $$C_{ox} = \frac{\varepsilon_{ox}}{T_{ox}}$$

$$C = \sqrt{\frac{2\varepsilon_{Si} q N_{sub0}}{\beta}}$$

$$\Phi_B = \frac{1}{\beta}\log\left(\frac{N_{sub0}}{n_i}\right)$$

$$\beta = \frac{q}{k_B T}$$

$$\phi_{s0} = \frac{q}{\varepsilon_{Si}}\int_0^{W_{dep}} N(x, z) z\, dz + \frac{1}{\beta} + V_B$$

$$N_{sub} = \frac{\left(\int_0^{W_{dep}} N(x, z) dz\right)^2}{2\int_0^{W_{dep}} N(x, z) z\, dz}$$

$$N_{sub0} = N(x, 0).$$

10. The non-transient computer-readable recording medium according to claim 9, wherein said correcting the surface potential comprises:

calculating the corrected surface potential based on the interaction, by solving simultaneous equations of a quasi 2-dimensional Poisson equation based on a charge density in an inversion layer surface and a current continuation equation indicating that a current between the node points is constant, through an iterative calculation method by using the surface potential as an initial value, wherein when W is a gate width, μ is a mobility of carrier, and $Q_i$ is a channel charge density, the current $I_D$ is expressed by the following equation:

$$I_D = W\mu Q_i \frac{d\phi_f}{dx}$$

wherein when $\phi_S$ is the corrected surface potential, $Q_g$ a gate charge density, and $Q_{b0}$ is a charge density in the inversion layer surface, the quasi 2-dimensional Poisson equation is expressed by the following equation:

$$Q_g - Q_i + EQ_{b0} = \sqrt{C^2 \frac{N_{sub}}{N_{sub0}}(\beta(\phi_s - V_B) - 1 + \exp(-\beta(\phi_s - V_B))) + EQ_{b0}^2}$$

here, the following equations are met:

$$Q_g = C_{ox}(V_G - V_{FB} - \phi_s)$$

$$Q_i = Q_g - \sqrt{Q_g^2 - C^2 \exp(\beta(\phi_s - \phi_f - 2\Phi_B))}$$

$$E = \frac{\varepsilon_{Si} W_{dep}}{Q_{b0}} \frac{d^2 \phi_s}{dx^2}$$

$$Q_{b0} = C\sqrt{\frac{N_{sub}}{N_{sub0}}(\beta(\phi_{s0} - V_B) - 1 + \exp(-\beta(\phi_{s0} - V_B)))}.$$

11. The non-transient computer-readable recording medium according to claim 9, wherein said correcting the surface potential comprises:

calculating the corrected surface potential based on the interaction, by solving simultaneous equations of a quasi 2-dimensional Poisson equation based on a charge density in an inversion layer surface and a current continuation equation indicating that a current between the node points is constant, by an iterative calculation method by using the surface potential as an initial value, wherein when W is a gate width, $\mu$ is a mobility of carrier, and $Q_i$ is a channel charge density, the current $I_D$ is expressed by the following equation:

$$I_D = W\mu Q_i \frac{d\phi_f}{dx}$$

wherein when $\phi_S$ is the corrected surface potential, $Q_g$ a gate charge density, $Q_{b0}$ is a charge density in the inversion layer surface, and $\Delta E$ is a correction term for a short channel effect, the quasi 2-dimensional Poisson equation is expressed by the following equation:

$$Q_g - Q_i + EQ_{b0} = \sqrt{C^2 \frac{N_{sub}}{N_{sub0}}(\beta(\phi_s - V_B) - 1 + \exp(-\beta(\phi_s - V_B))) + EQ_{b0}^2}$$

here, the following equations are met:

$$Q_g = C_{ox}(V_G - V_{FB} - \phi_s)$$

$$Q_i = Q_g - \sqrt{Q_g^2 - C^2 \exp(\beta(\phi_s - \phi_f - 2\Phi_B))}$$

$$E = \frac{\varepsilon_{Si} W_{dep}}{Q_{b0}} \frac{d^2 \phi_s}{dx^2} + \Delta E$$

$$Q_{b0} = C\sqrt{\frac{N_{sub}}{N_{sub0}}(\beta(\phi_{s0} - V_B) - 1 + \exp(-\beta(\phi_{s0} - V_B)))}.$$

* * * * *